(12) United States Patent
Li et al.

(10) Patent No.: US 8,410,866 B2
(45) Date of Patent: Apr. 2, 2013

(54) RADIO FREQUENCY FILTER AND FILTERING UNIT THEREOF

(75) Inventors: Shen-Chun Li, Taipei Hsien (TW); Shou-Kuo Hsu, Taipei Hsien (TW); Yung-Chieh Chen, Taipei Hsien (TW); Hsiao-Yun Su, Taipei Hsien (TW); Hsien-Chuan Liang, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 664 days.

(21) Appl. No.: 12/646,867

(22) Filed: Dec. 23, 2009

(65) Prior Publication Data

US 2011/0043302 A1     Feb. 24, 2011

(30) Foreign Application Priority Data

Aug. 24, 2009  (CN) .......................... 2009 1 0305980

(51) Int. Cl.
*H03H 7/01* (2006.01)

(52) U.S. Cl. ........................................ 333/168; 333/185
(58) Field of Classification Search .................. 333/175, 333/168, 176, 185
See application file for complete search history.

(56) References Cited

U.S. PATENT DOCUMENTS

2012/0161901 A1*  6/2012  Stevenson et al. ............ 333/175

\* cited by examiner

*Primary Examiner* — Benny Lee
*Assistant Examiner* — Gerald Stevens
(74) *Attorney, Agent, or Firm* — Altis Law Group, Inc.

(57) ABSTRACT

Parameters of a radio frequency filter can be changed by changing structure of each component of the filter. Material of each component, diameters of each of magnetic cylinders, density of each of conductive coils, thickness of a dielectric layer, and thickness of an insulation tube can be changed. When any component needs to be replaced, each cover is rotated, with connection partitions moving to two slots of an insulation portion, to detach the filter.

11 Claims, 6 Drawing Sheets

RADIO FREQUENCY FILTER AND FILTERING UNIT THEREOF

CROSS-REFERENCE TO RELATED APPLICATIONS

A relevant subject matter is disclosed in a co-pending U.S. patent application Ser. No. 12/629,888 filed on Dec. 3, 2009 and entitled "RADIO FREQUENCY FILTER", a co-pending U.S. patent application Ser. No. 12/638,992 filed on Dec. 16, 2009 and entitled "RADIO FREQUENCY FILTER", and a co-pending U.S. patent application Ser. No. 12/646,872, filed on the same date and having the same title as the one for this patent application, which are assigned to the same assignee as this patent application.

BACKGROUND

1. Technical Field

The present disclosure relates to radio frequency (RF) filters, and particularly to an adjustable RF filter.

2. Description of Related Art

In response to various frequency bands of an electronic device, filters have also been demanded to remove noise in frequency bands. Filters are generally designed to remove noise from specific frequency bands, therefore different filters are designed for different applications. Filters designed in this way are not easily adjustable for use in applications other than what they were specifically designed for.

DETAILED DESCRIPTION

Figure 1:
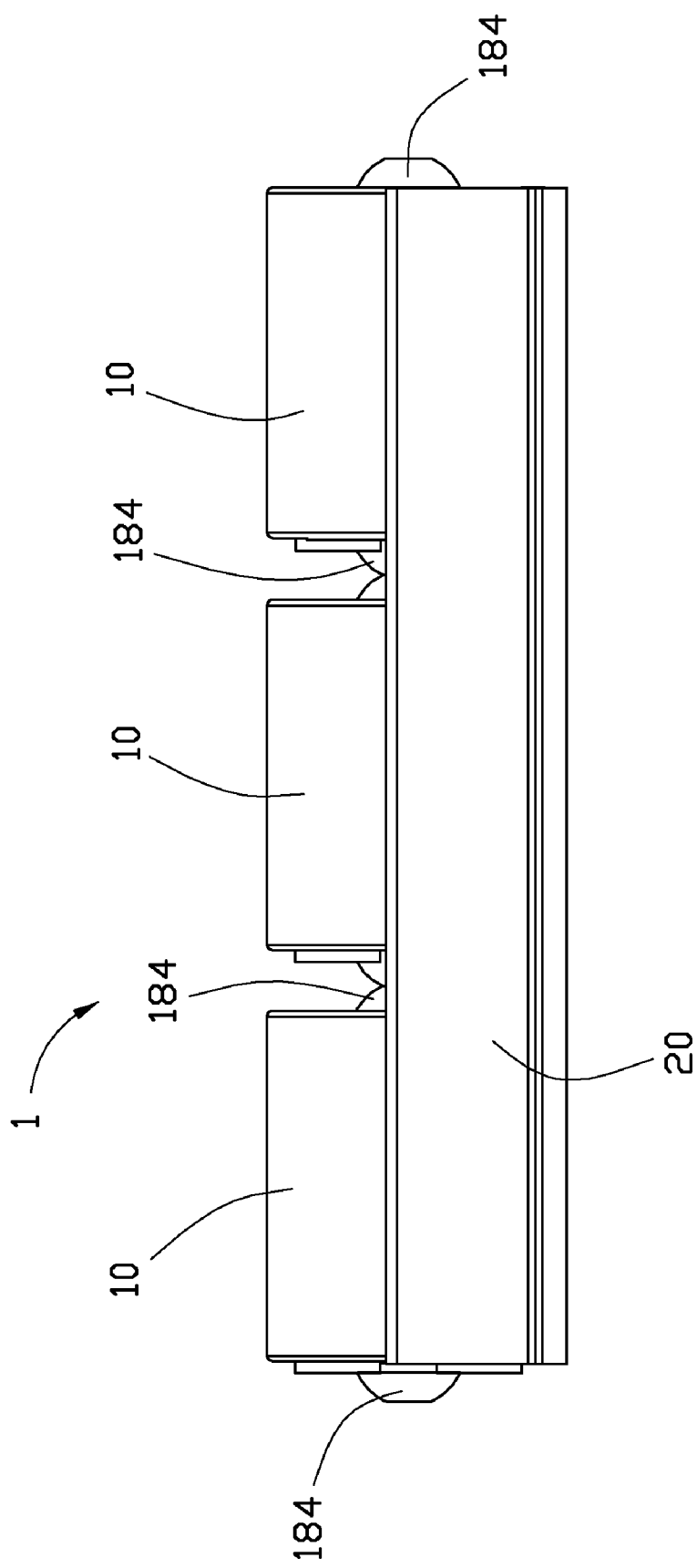
FIG. 1 is a front elevational view of an embodiment of a radio frequency (RF) filter.
Figure 2:
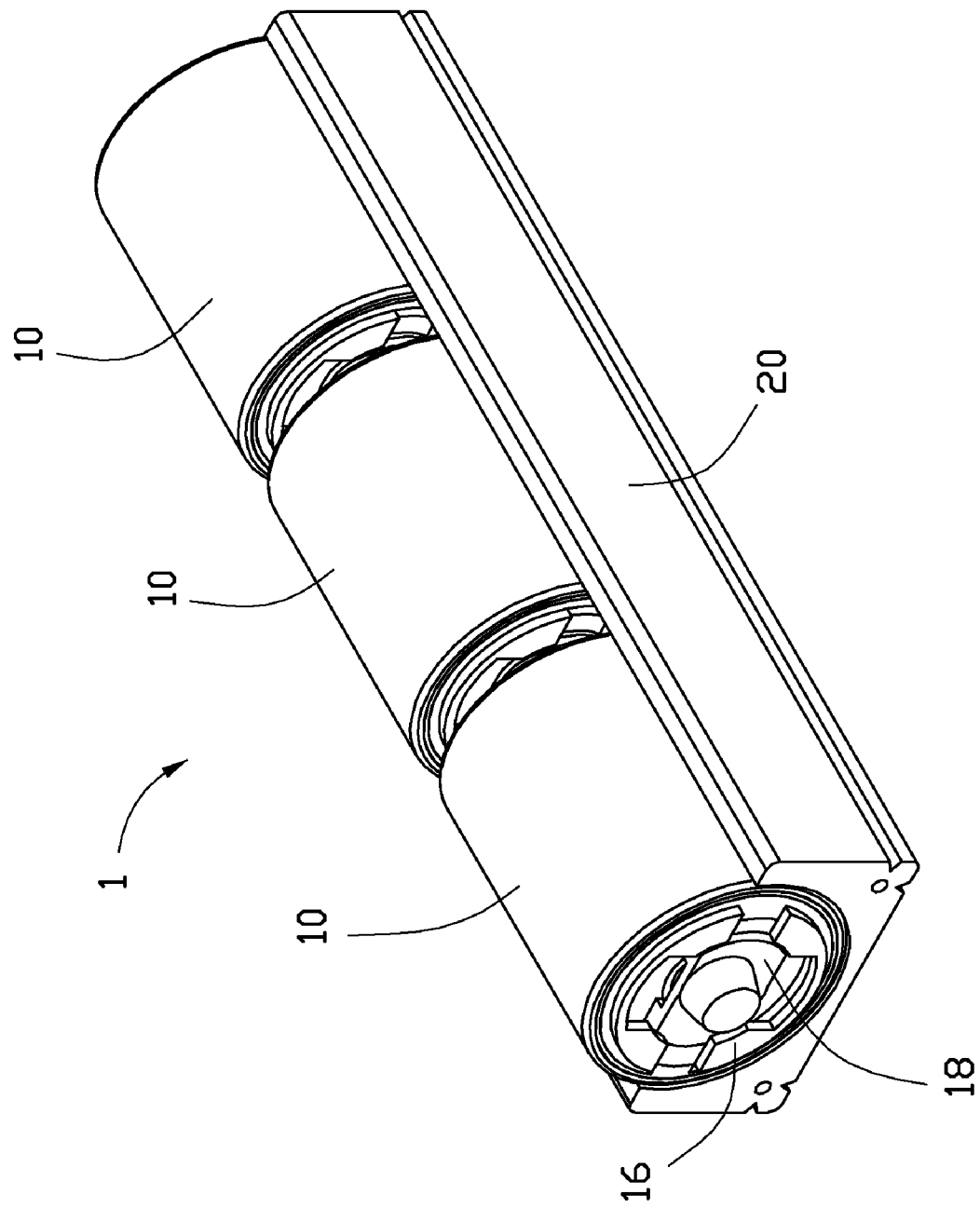
FIG. 2 is an isometric view of the RF filter of FIG. 1, the RF filter includes three filtering units.
Figure 3:
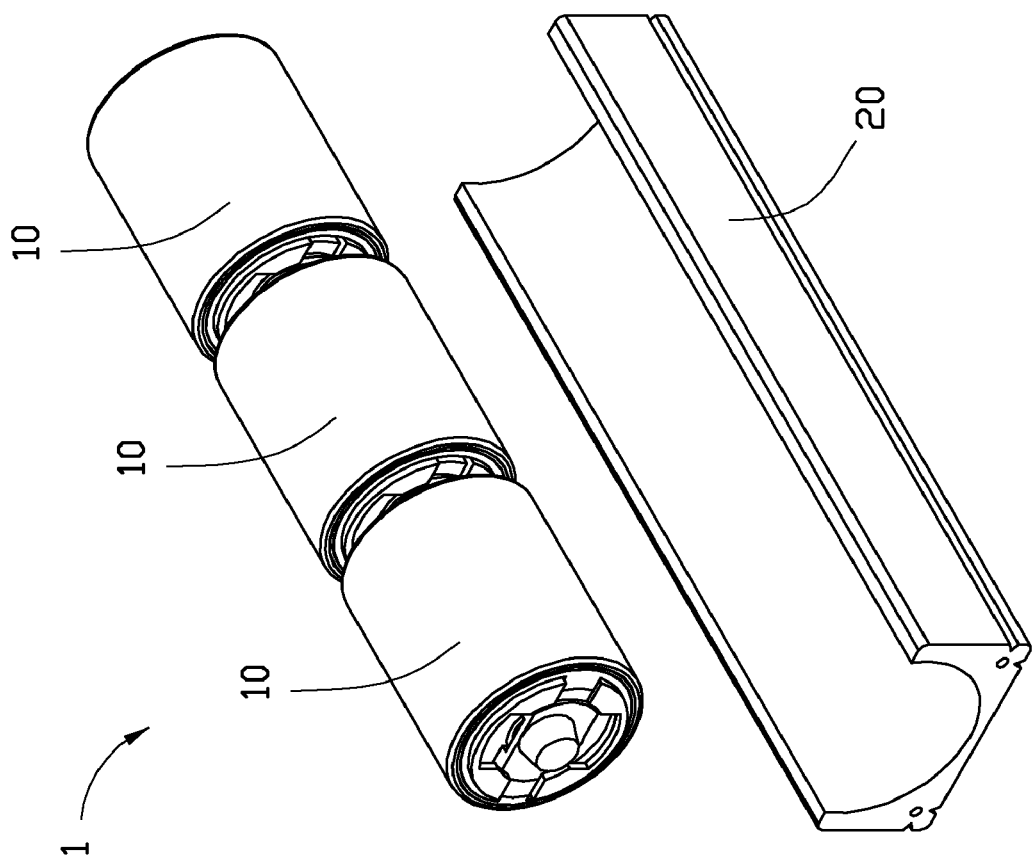
FIG. 3 is an exploded, isometric view of the RF filter of FIG. 2.

Referring to FIGS. 1 to 3, an embodiment of a radio frequency (RF) filter 1 includes at least one filtering units 10 and a receiver 20. In the illustrated embodiment, the at least one filtering units 10 includes three filtering units 10. The three filtering units 10 are placed in the receiver 20 in series. The receiver 20 is conductive and grounded.

Figure 4:
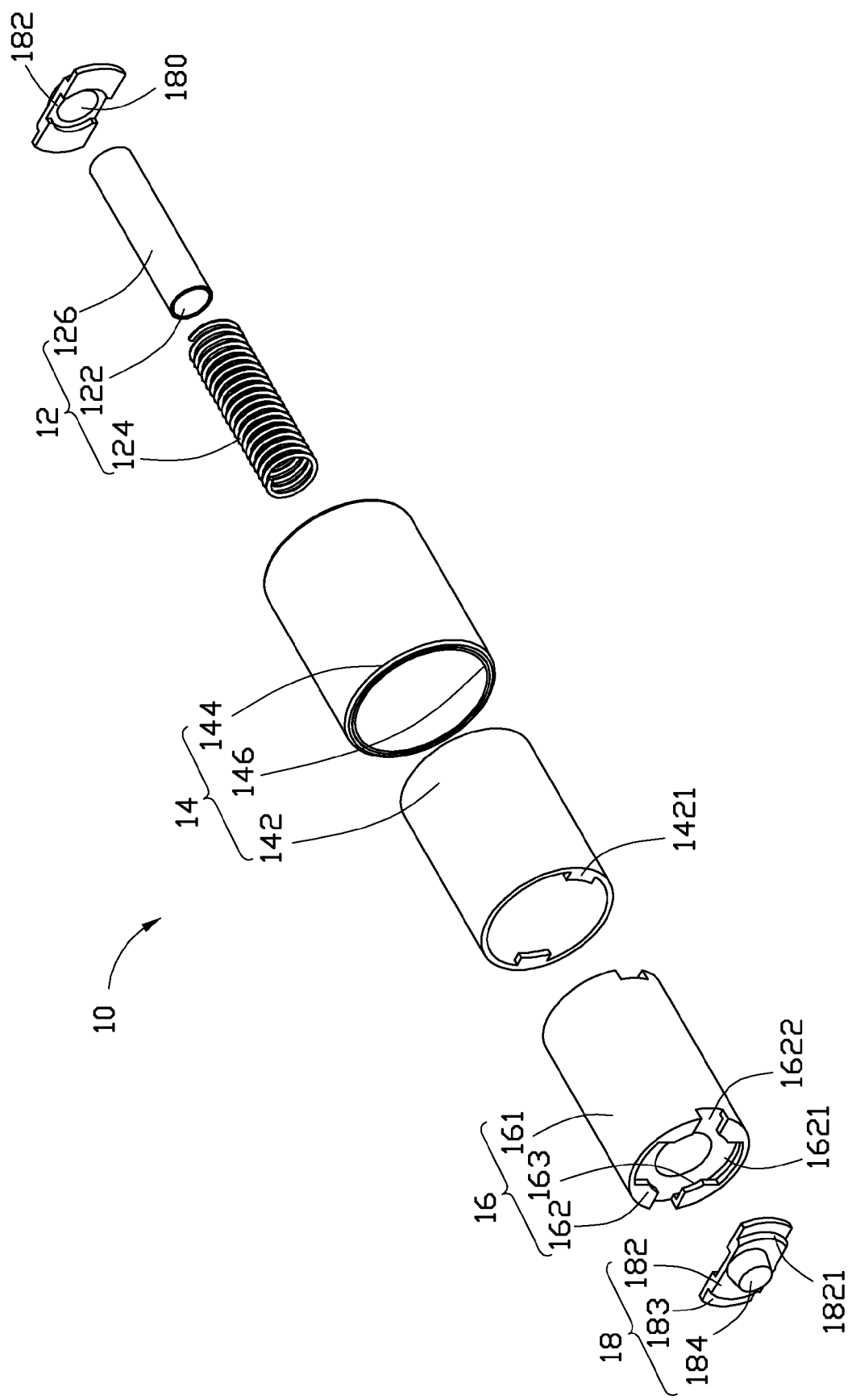
FIG. 4 is an exploded, isometric view of one of the three filtering units of FIG. 2, the filtering unit includes an insulation tube.
Figure 5:
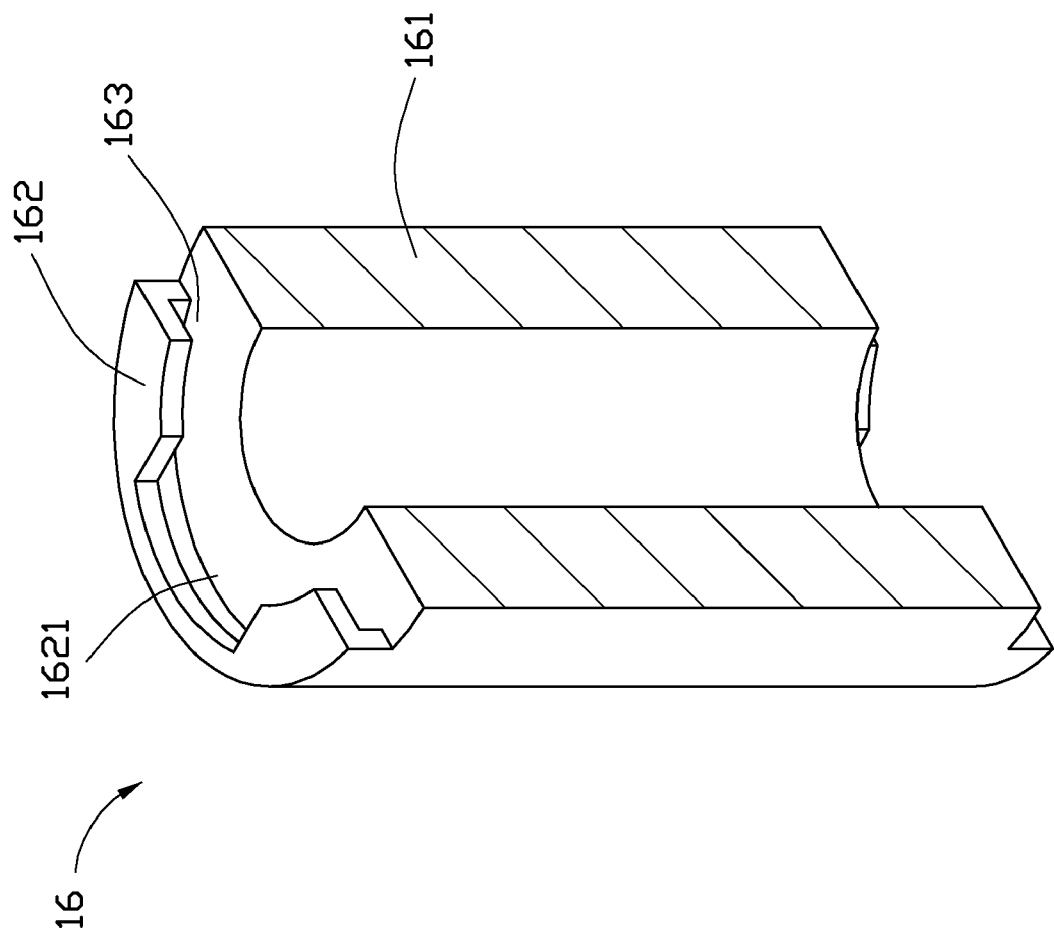
FIG. 5 is a sectional view of the insulation tube of FIG. 4.

Referring to FIGS. 4 and 5, each filtering unit 10 includes an inductive component 12, a capacitive component 14, an insulation tube 16, and two covers 18. The inductive component 12 includes a magnetic cylinder 122 and an elastic helical conductive coil 124. A dielectric layer 126 covers a circumference of the magnetic cylinder 122. The conductive coil 124 fits around the magnetic cylinder 122. The magnetic cylinder 122 can be made of a magnetizable material, such as iron, cobalt, nickel, etc, and the dielectric layer 126 can be made of glass fiber oxide resin. The inductive component 12 has inductor characteristics.

The capacitive component 14 includes a metal inner tube 142 and a metal outer tube 144. A dielectric layer 146 covers an inner wall of the metal outer tube 124. The metal outer tube 144 fits about the metal inner tube 142. Two contacting tabs 1421 radially and symmetrically project from an inner wall of an end of the metal inner tube 142. The capacitive component 14 has capacitor characteristics.

The insulation tube 16 includes a hollow cylindrical-shaped main body 161 and two annular-shaped insulation portions 162 extending from opposite end surfaces of the main body 161. A receiving cavity 163 is defined between each end surface of the main body 161 and a corresponding insulation portion 162. Two grooves 1621 are symmetrically defined in each insulation portion 162. Two slots 1622 are symmetrically defined in each insulation portion 162. The two grooves 1621 and the two slots 1622 are staggeredly arranged and communicate with one another.

The two covers 18 have conductive characteristics. Each cover 18 includes a main body 182 with two opposite arc-shaped edges 1821, and two arc-shaped connection portions 183 extending out from the corresponding edges 1821. The connection portions 183 are depressed to a bottom of the main body 182. A circular-shaped opening 180 is defined in a center of the bottom of the main body 182. A protrusion 184 is formed from a side bounding the opening 180 of the cover 18 and covers the opening 180. A width of each connection portion 183 is less than or equal to a width of a corresponding groove 1621 of the insulation tube 16, and is greater than a width of a corresponding slot 1622 of the insulation tube 16.

In assembly, the capacitance component 14 fits about the insulation tube 16. The inductive component 12 is received in the insulation tube 16. The two contacting tabs 1421 of the metal inner tube 142 pass through the two slots 1622 correspondingly. The covers 18 are mounted to opposite ends of the insulation tube 16 via the grooves 1621. The connection portions 183 of each cover 18 are received in a corresponding receiving cavity 163 through the grooves 1622 of a corresponding insulation portion 162. The two edges 1821 of each main body 182 resist against the corresponding insulation portion 162. The connection portions 183 of each cover 18 can rotatably slide in the corresponding receiving cavity 163, allowing the cover 18 to be rotatably mounted on the insulation tube 16. The two contacting tabs 1421 contact with the two connection portions 183 of one of the covers 18 respectively. A first end of the conductive coil 124 resists against one of the covers 18. A second end of the conductive coil 124 resists against the other cover 18. Because the covers 18 are conductive, the first end of the conductive coil 124 is electrically connected to the contacting tabs 1421 of the metal inner tube 142 via the corresponding cover 18.

The metal outer tubes 144 of the capacitance components 14 contacts with the receiver 20. Therefore, the metal outer tubes 144 are grounded. The cover 18 connected to the second end of the conductive coil 124 is used as an input terminal of each of the filtering units 10. The cover 18 connected to the first end of the conductive coil 124 is used as an output terminal of each of the filtering unit 10. The input terminal of each of the filtering unit 10 receives external signals from an electronic device or is connected to an output terminal of another filtering unit 10. The output terminal of each of the filtering unit 10 is connected to an output terminal of another filtering unit 10, or outputs filtered signals to another electronic device. In this embodiment, the three filtering units 10 are connected in series via the protrusions 184 of the corresponding covers 18.

In this embodiment, the number of the contacting tabs 1421 can be changed to be greater or less than two. The number of the slots 1622 changes with the number of the contacting tabs 1421. The slots 1622 may be defined only in one of the insulation portions 162. The insulation tube 16 can prevent the inductive component 12 from interfering with the capacitive component 14.

Figure 6:
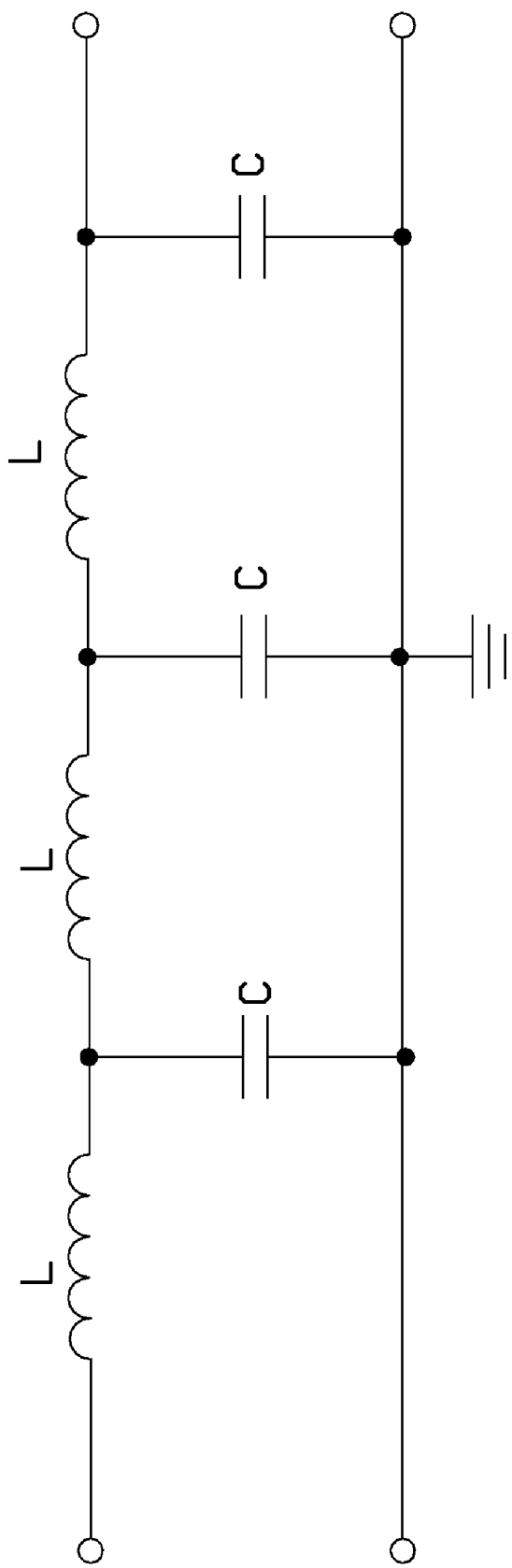
FIG. 6 is an equivalent circuit diagram of the RF filter of FIG. 1.

Referring to FIG. 6, an equivalent circuit of the filter 1 includes three inductors L, and three capacitors C. The inductors L are connected in series. The three capacitors C are connected in parallel. Where, the inductive component 12 and the capacitance 14 of each of the filtering units 10 is equivalent to an inductor L and a corresponding capacitor C which are connected in series. The metal inner tube 142 and the metal outer tube 144 of each of the capacitive components 14 are equivalent to first and second terminals of the corresponding capacitor C. The second terminals of the capacitors C are grounded. Therefore, the filter 1 functions as a low pass filter.

Parameters of the filter 1 can be changed by changing structure of each component of the filter 1. For example, material of each component, diameters of each of the magnetic cylinders 122, density of each of the conductive coils 124, thickness of the dielectric layers 126, thickness of the insulation tubes 16, and number of the filtering unit 10 can be changed. When any component needs to be replaced, a corresponding cover 18 is rotated, with the connection partitions 183 moving to the two grooves 1621, to detach the filter 1.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A filtering unit comprising:
   an insulation tube;
   an inductance component received in the insulation tube;
   two conductive covers, each being detachably mounted to a corresponding one of opposite ends of the insulation tube, and electrically contacting with two ends of the inductance component at the opposite ends of the insulation tube, respectively; and
   a capacitance component having a metal inner tube fitting around the insulation tube, a metal outer tube insulated from and fitting around the metal inner tube, wherein
      at least one contacting tab perpendicularly projects from an inner wall of the metal inner tube and passes through the insulation tube to contact with one of the two conductive covers, the metal outer tube is grounded.

2. The filtering unit of claim 1, wherein the insulation tube comprises a hollow main body and two insulation portions extending from opposite end surfaces of the main body, respectively, a receiving cavity is defined between each one of the two insulation portions and a corresponding one of the opposite end surfaces, to receive a corresponding one of the two conductive covers, two grooves are symmetrically defined in each one of the two insulation portions, allowing a corresponding conductive cover to enter into the corresponding receiving cavity, at least one slot is defined in one of the two insulation portions, allowing the at least one contacting tab to pass through the insulation tube.

3. The filtering unit of claim 2, wherein each of the two conductive covers comprises a main body, the main body comprises two opposite edges and two connection portions extending out from the two opposite edges respectively, the two connection portions are depressed to a bottom of the main body, the two connection portions are received in the receiving cavity from the grooves of the insulation portion, with the two edges of the main body resisting against the corresponding insulation portion, the two connection portions are operable to rotatably slide in the corresponding receiving cavity, the at least one contacting tab of the metal inner tube electrically contacts with at least one of the two connection portions of the one of the two conductive covers.

4. The filtering unit of claim 1, wherein the inductive component includes a magnetic cylinder and a conductive coil, a dielectric layer covers a circumference of the magnetic cylinder, and the conductive coil fits about the magnetic cylinder, two ends of the conductive coil function as the two ends of the inductance component respectively.

5. The filtering unit of claim 4, wherein the dielectric layer is made of glass fiber oxide resin.

6. The filtering unit of claim 4, wherein the magnetic cylinder is made of a magnetizable material.

7. The filtering unit of claim 1, wherein each of the two conductive covers comprises a main body, an opening is defined in a center of the main body, a protrusion is formed from the main body of each of the two conductive covers and covers the corresponding opening, the protrusions of the main bodies of the two conductive covers function as an input terminal and an output terminal of the filtering unit, respectively.

8. The filtering unit of claim 1, further comprising a receiver, to ground the metal outer tube by receiving the metal outer tube.

9. A radio filter comprising a plurality of filtering units, each filtering unit comprises:
   an insulation tube;
   an inductance component received in the insulation tube, the inductance component comprising a first end and a second end;
   a first conductive cover and a second conductive cover detachably mounted to opposite ends of the insulation tube, and electrically contacting with the first and second ends of the inductance component respectively; and
   a capacitance component comprising a metal inner tube fitting around the insulation tube, a metal outer tube insulated from and fitting around the metal inner tube, at least one contacting tab perpendicularly projecting from an inner wall of the metal inner tube and passing through the insulation tube to contact with the second conductive cover, wherein
      the metal outer tube is grounded, the first and second conductive covers function as an input terminal and an output terminal of each filtering unit, the plurality of filtering units are connected in series with one of the first conductive covers receiving external signals and one of the second conductive covers outputting filtered signals.

10. The radio filter of claim 9, further comprising a receiver, the plurality of filtering units are placed in the receiver in series, with the metal outer tube contacting with the receiver, the receiver is conductive and grounded.

11. The radio filter of claim 9, wherein each of the first and second conductive covers comprises a main body, an opening is defined in a center of the main body, a protrusion is formed from the main body of each of the two conductive covers and covers the corresponding opening, the protrusion of each first conductive cover contacts with a protrusion of a corresponding one of the second conductive covers, or receives the external signals, the protrusion of each one of the first conductive covers contacts with a protrusion of a corresponding second conductive cover, or outputs the filtered signals.

* * * * *